US007977228B2

United States Patent
Ramachandrarao

(10) Patent No.: US 7,977,228 B2
(45) Date of Patent: Jul. 12, 2011

(54) METHODS FOR THE FORMATION OF INTERCONNECTS SEPARATED BY AIR GAPS

(75) Inventor: Vijayakumar S. Ramachandrarao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 399 days.

(21) Appl. No.: 11/478,874

(22) Filed: Jun. 29, 2006

(65) Prior Publication Data

US 2008/0003794 A1    Jan. 3, 2008

(51) Int. Cl.
*H01L 21/44* (2006.01)

(52) U.S. Cl. ........ 438/597; 438/689; 438/745; 438/756; 438/757; 257/E21.221; 257/E21.223; 257/E21.309

(58) Field of Classification Search .................. 438/689, 438/745, 756, 757, 597; 257/E21.221, E21.223, 257/E21.309
See application file for complete search history.

(56) References Cited

U.S. PATENT DOCUMENTS

| 6,592,777 | B2 * | 7/2003 | Chen et al. | 252/79.1 |
| 7,271,103 | B2 * | 9/2007 | Huang et al. | 438/706 |
| 7,304,388 | B2 * | 12/2007 | Dubin et al. | 257/762 |
| 7,396,757 | B2 * | 7/2008 | Yang | 438/619 |
| 2004/0146803 | A1 * | 7/2004 | Kohl et al. | 430/270.1 |
| 2004/0224498 | A1 * | 11/2004 | Oh et al. | 438/637 |
| 2004/0226654 | A1 * | 11/2004 | Hongo et al. | 156/345.11 |
| 2004/0266167 | A1 * | 12/2004 | Dubin et al. | 438/619 |
| 2005/0176603 | A1 * | 8/2005 | Hsu | 510/175 |
| 2007/0257368 | A1 * | 11/2007 | Hussein et al. | 257/758 |
| 2007/0284744 | A1 * | 12/2007 | Dubin et al. | 257/751 |
| 2008/0079172 | A1 * | 4/2008 | Hsu et al. | 257/774 |
| 2008/0185722 | A1 * | 8/2008 | Liu et al. | 257/751 |
| 2008/0217731 | A1 * | 9/2008 | Yang | 257/522 |

OTHER PUBLICATIONS

Junji Noguchi et al., "Process and Reliability of Air-Gap Cu Interconnect Using 90-nm Node Technology", IEEE Transactions on Electron Devices, vol. 52, No. 3, Mar. 2005, pp. 352-359.*
Makarem A. Hussein et al., "Dielectric Spacers for Metal Interconnects and Method to Form the Same", U.S. Appl. No. 11/429,165, filed May 4, 2006.
Kelvin Chan et al., "Air-Gap Fabrication Using a Sacrificial Polymeric Thin Film Synthesized Via Initiated Chemical Vapor Deposition", *Journal of the Electrochemical Society*, vol. 153, No. 4, 2006, p. C223-C228.
Junji Noguchi et al., "Process and Reliability of Air-Gap Cu Interconnect Using 90-nm Node Technology", *IEEE Transactions on Electron Devices*, vol. 52, No. 3, Mar. 2005, p. 352-359.

* cited by examiner

*Primary Examiner* — Charles D Garber
*Assistant Examiner* — Leonard Chang
(74) *Attorney, Agent, or Firm* — Blakely, Sokoloff, Taylor & Zafman LLP

(57) ABSTRACT

The microelectronic device interconnects are fabricated by a process that utilizes a silicon-based interlayer dielectric material layer, such as carbon-doped oxide, and a chemical mixture selective to materials used in the formation of the interconnects, including, but not limited to, copper, cobalt, tantalum, and/or tantalum nitride, to remove the interlayer dielectric material layer between adjacent interconnects thereby forming air gaps therebetween.

16 Claims, 7 Drawing Sheets

METHODS FOR THE FORMATION OF INTERCONNECTS SEPARATED BY AIR GAPS

BACKGROUND OF THE INVENTION

1. Field of the Invention

An embodiment of the present invention relates to microelectronic device fabrication. In particular, an embodiment of the present invention relates to methods for forming copper interconnects.

2. State of the Art

The microelectronic device industry continues to see tremendous advances in technologies that permit increased integrated circuit density and complexity, and equally dramatic decreases in package sizes. Present semiconductor technology now permits single-chip microprocessors with many millions of transistors, operating at speeds of tens (or even hundreds) of MIPS (millions of instructions per second), to be packaged in relatively small, air-cooled microelectronic device packages. These transistors are generally connected to one another or to devices external to the microelectronic device by conductive traces and contacts (hereinafter referred to collectively as "interconnects") through which electronic signals are sent and/or received.

A typical process of forming interconnects includes patterning a photoresist material on an interlayer dielectric material and plasma etching the interlayer dielectric material through the photoresist material pattern to form a hole and/or a trench (hereinafter referred to collectively as an "opening") extending into the interlayer dielectric material. The photoresist material (which may also include hard mask and anti-reflective coating layers) is then removed (typically by an oxygen or hydrogen plasma followed by wet cleans or all-wet cleans) and a barrier layer may be deposited within the opening to prevent conductive material (particularly copper and copper-containing alloys), which will be subsequently deposited into the opening, from migrating into interlayer dielectric material. The migration of the conductive material can adversely affect the quality of microelectronic device, such as leakage current and reliability of the interconnects. Thus, a barrier layer is deposited onto a dielectric layer to line the opening. In addition to lining the opening, a separate barrier layer is deposited across a top surface of the dielectric layer.

A seed material may then be deposited on the barrier layer, followed by performing a conventional electroplating process to form a conductive material layer. Like the barrier layer, excess conductive material layer may form on barrier layer covering the dielectric layer. The resulting structure is planarized, usually by a technique called chemical mechanical polish (CMP), which removes a portion of the conductive material layer and the barrier layer that are not within the opening from the surface of the dielectric material, to form the interconnect structure, which is electrically segregated from other such interconnect structures.

Although this is an effective way of forming an interconnect, as the size of the integrated circuitry decreases, the interlayer dielectric material becomes less able to prevent cross-talk between adjacent interconnects, as will be understood to those skilled in the art. Thus, there has been a movement to completely remove the interlayer dielectric from between the interconnects, thereby allowing an air gap to act as the dielectric (i.e., air has a dielectric constant of 1.0). However, the removal of the interlayer dielectric material has issues. With carbon-based interlayer dielectrics, removal thereof is achieved by a reducing plasma etch chemistry. However, such a removal process can result in interconnect electrical damage and/or corner rounding of the interconnects due to the ion bombardment during the process. With silicon-based interlayer dielectrics, removal thereof is achieved by a fluorine-based wet chemistry, which can potentially damage the interconnect and any capping layer (such as copper and electroless cobalt, respectively) as it is not particularly selectively to such materials. Silicon-based interlayer dielectrics may also be removed with a CFx plasma chemistry, which can result in corner rounding and/or sputtering of the interconnect material (such as copper), as will be understood by those skilled in the art.

Therefore, it would be advantageous to develop techniques to form an interconnect having an air gap dielectric, which reduces or substantially eliminates the potential of damage to the interconnect structure.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Figure 1:
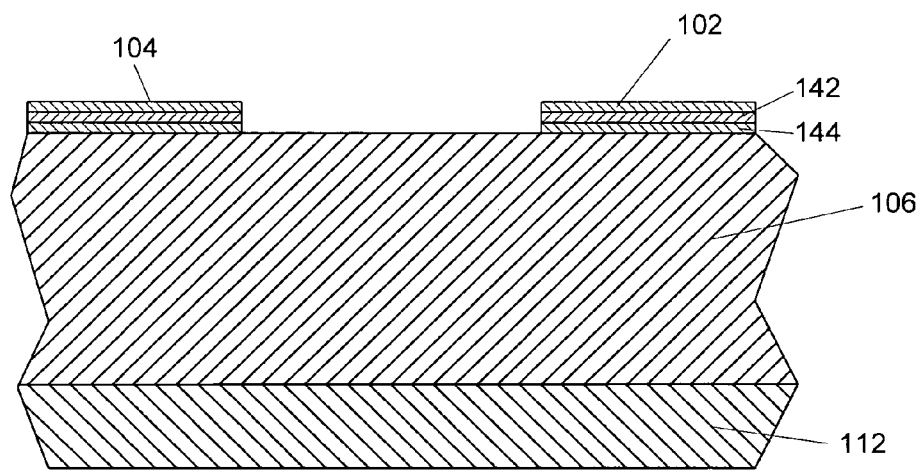
FIG. 1 is a side cross-sectional view of a dielectric layer having a photoresist patterned thereon, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

An embodiment of the present invention relates to the fabrication of microelectronic device interconnects, wherein the fabrication process utilizes a silicon-based interlayer dielectric material layer and a chemical mixture selective to materials used in the formation of the interconnect, including, but not limited to, copper, cobalt, tantalum, and/or tantalum nitride, which removes the interlayer dielectric material layer from between adjacent interconnects thereby forming air gaps therebetween.

Figure 2:
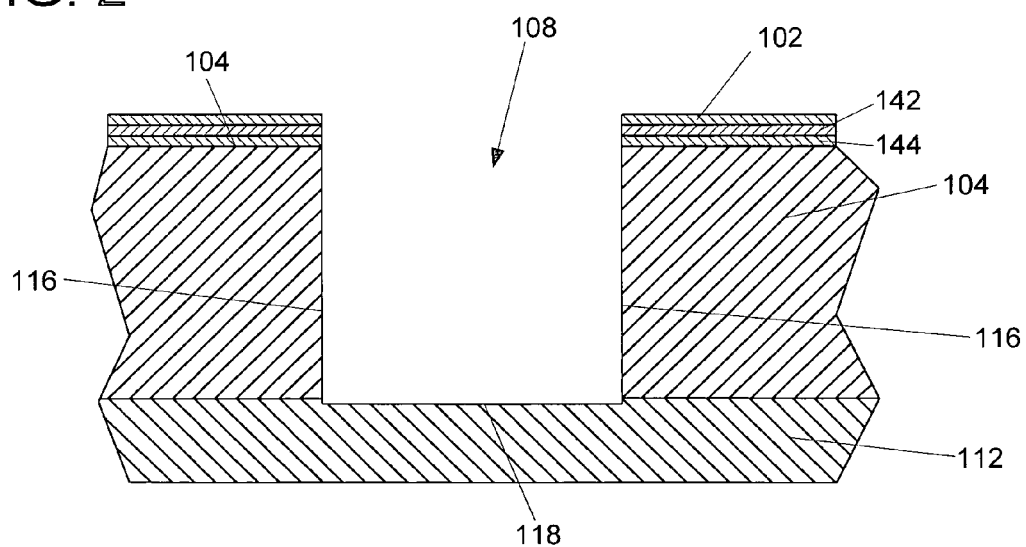
FIG. 2 is a side cross-sectional view of the structure of FIG. 1, wherein an opening is formed in the dielectric material layer through the photoresist pattern, according to the present invention.
Figure 3:
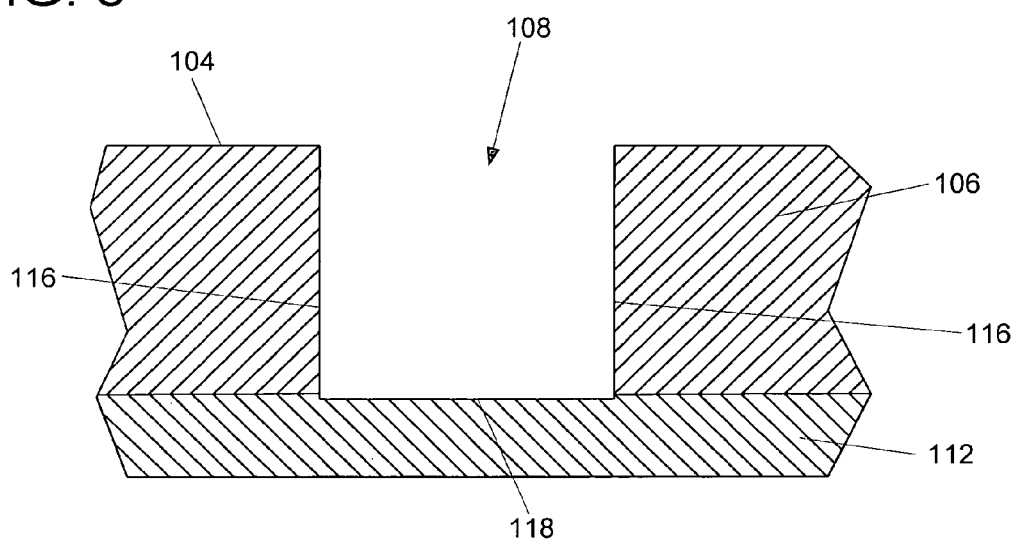
FIG. 3 is a side cross-sectional view of the structure of FIG. 2, wherein the photoresist is removed, according to the present invention.

One embodiment of a process used to form an interconnect according to the present invention, comprises patterning a photoresist material 102 on a first surface 104 of a sacrificial dielectric material layer 106, as shown in FIG. 1. An anti-reflective coating 142 and a metal hard mask 144 may also be utilized, as will be understood to those skilled in the art. The sacrificial dielectric material layer 106 is preferably a silicon-containing material and may include, but is not limited to, silicon dioxide, silicon nitride, carbon doped oxide, and the like, and may be porous or non-porous. The sacrificial dielectric material layer 106 is etched through the photoresist material 102/anti-reflective coating 142/hard mask 144 patterning to form a hole or trench (hereinafter collectively referred to as "opening 108") extending at least partially through the sacrificial dielectric material layer 106 from the sacrificial dielectric material layer first surface 104 thereof, and may extend through the sacrificial dielectric material layer 106 to a substrate 112, such as a dielectric layer, a conductive material, a silicon wafer, and the like, as shown in FIG. 2. It is, of course, understood that the opening 108 can be formed by any known technique including, but not limited to, ion milling and laser ablation. The photoresist material 102/anti-reflective coating 142/hard mask 144 is then removed (typically by an oxygen plasma or hydrogen plasma followed by a cleaning process, such as wet cleans or all-wet cleans), as shown in FIG. 3.

It is, of course, understood that the etching material/process used to form opening 108 should be selective to the substrate 112. However, it is preferred that at least a portion of the substrate 112 is etched to form a recess therein. This will result in a subsequently formed interconnect being anchored in the substrate 112, which will prevent the interconnect from lifting during the subsequent etching process to remove the sacrificial dielectric material layer 106, as will be understood to those skilled in the art.

Figure 4:
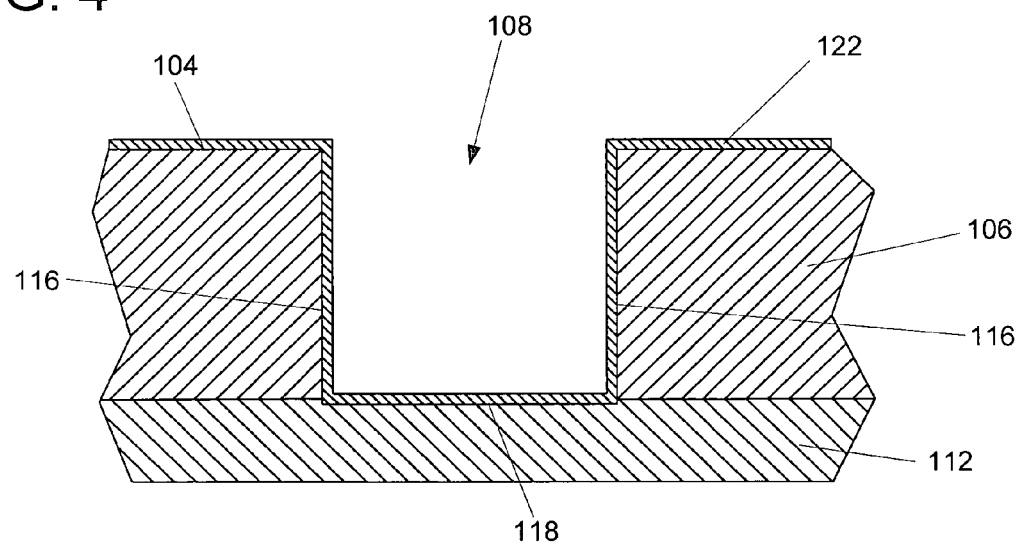
FIG. 4 is a side cross-sectional view of the structure of FIG. 3, wherein a barrier layer is formed on adjacent sides and a bottom of the opening, according to the present invention.

As shown in FIG. 4, a barrier layer 122, including but not limited to tantalum, tantalum nitride, titanium, and titanium nitride, may then be formed on sidewall(s) 116 and a bottom 118 of the opening 108. A barrier layer 122 is deposited to act as a diffusion barrier, which keeps a subsequently deposited conductive material layer from diffusing into the sacrificial dielectric material layer 106. The barrier layer 122 may be deposited by any means know in the art, including atomic layer deposition, chemical vapor deposition, physical vapor deposition, and the like.

Figure 5:
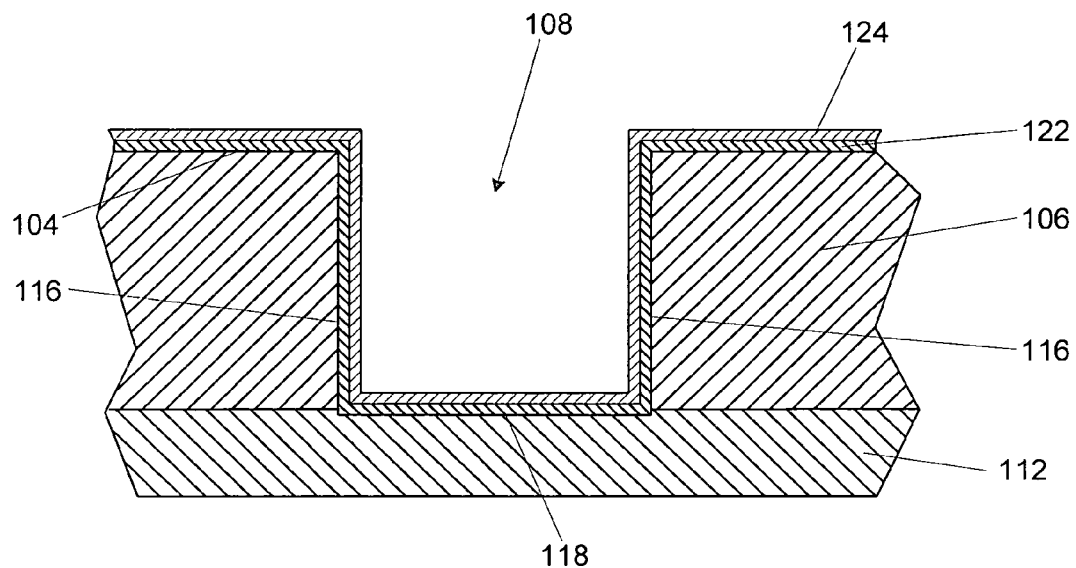
FIG. 5 is a side cross-sectional view of the structure of FIG. 4, wherein an optional seed layer is formed over the barrier layer, according to the present invention.

As shown in FIG. 5, a seed material 124 may be deposited on the barrier layer 122 by any method known in the art, including atomic layer deposition, chemical vapor deposition, physical vapor deposition, and the like. The seed layer 124 is generally deposited on the barrier layer 122, when an electroplating process will be used to deposit the subsequently deposited conductive material layer, as the deposited seed layer 124 will provide a surface to which the subsequently deposited conductive material will be electroplated. The seed layer 124 may be a copper-containing material deposited by chemical or physical deposition techniques. It is, of course, understood that the barrier layer 122 may be such that it acts a seed, which obviates the need for the use of the seed layer 124.

Figure 6:
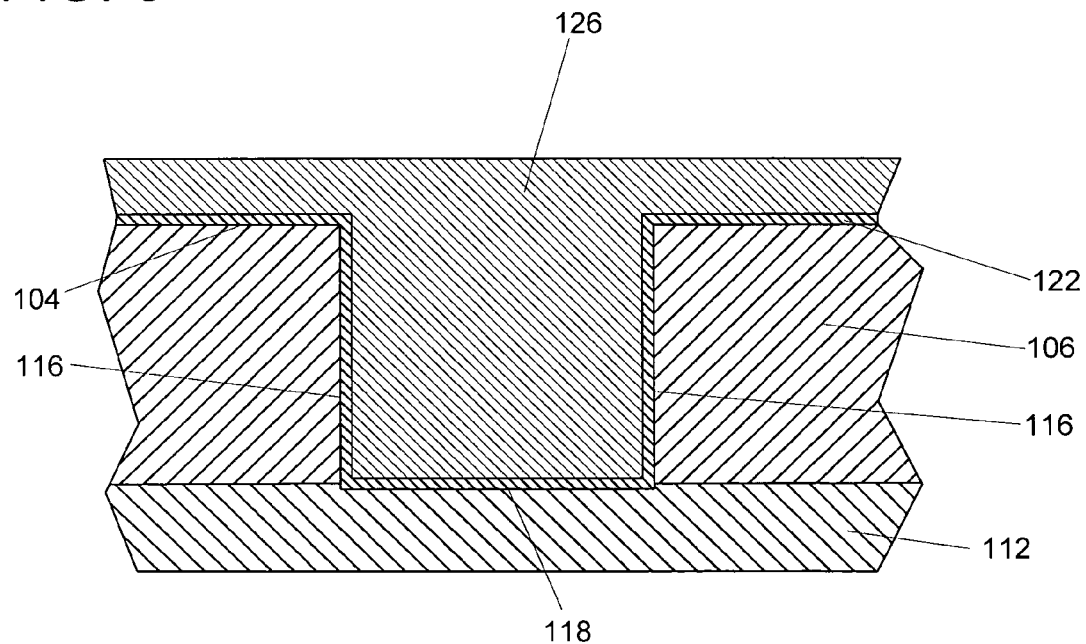
FIG. 6 is a side cross-sectional view of the structure of FIG. 5, wherein a conductive material is disposed within the opening, according to the present invention.

The opening 108 (see FIG. 5) is then filled with a conductive material, such as copper, aluminum, alloys thereof, and the like, as shown in FIG. 6, to form a conductive material layer 126. In one embodiment, the conductive material may be a copper-containing material, including, but are not limited to, copper (Cu), copper-tin (CuSn), copper-indium (CuIn), copper-cadmium (CuCd), copper-bismuth (CuBi), copper-rutherium (CuRu), copper-rhodium (CuRh), copper-rhenium (CuRe), and copper-tungsten (CuW). The conductive material layer 126 may be formed by any method known in the art, including, but not limited to, electroplating, chemical vapor deposition, physical vapor deposition, and the like. If a seed layer 124 is used (see FIG. 5) with an electroplating process, the seed layer 124 will be subsumed into the conductive material layer 126.

Figure 7:
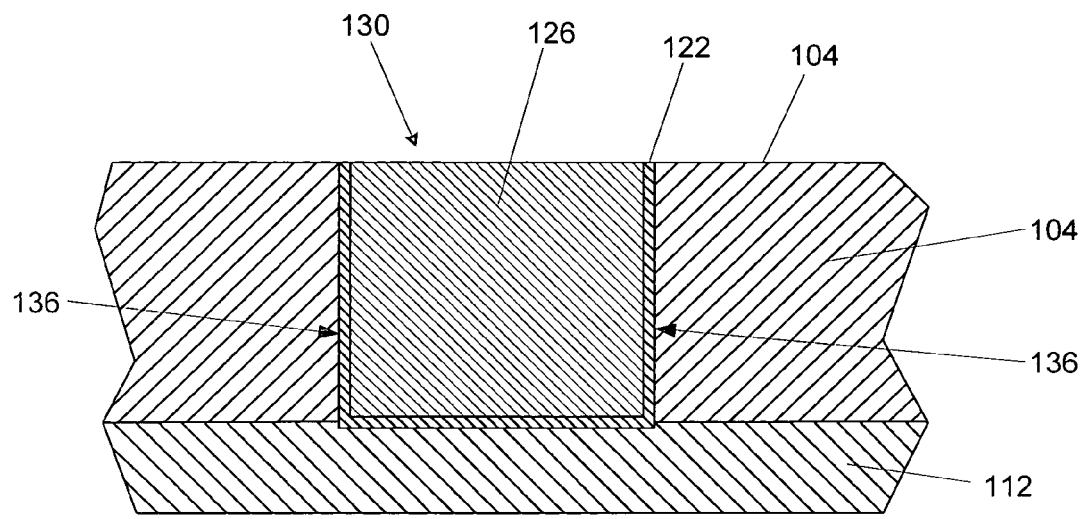
FIG. 7 is a side cross-sectional view of the structure of FIG. 6, wherein a portion of the conductive material not within the opening is removed to form an intermediate interconnect, according to the present invention.

Any portion of the conductive material layer 126 and the barrier layer 122 that is not within the opening 108 (see FIG. 5) is removed from the sacrificial dielectric material layer first surface 104, to form an intermediate interconnect 130, as shown in FIG. 7, wherein the sacrificial dielectric material layer abuts at least one side 136 of the intermediate interconnect 130. The removal of the portion of the conductive material layer 126 may be achieved by any technique known in the art, including, but not limited to, chemical mechanical polish, electropolishing, etching, and the like.

A capping layer 132 may be optionally formed on an exposed portion of the intermediate interconnect 130. In one embodiment, the capping layer 132 is a cobalt-containing material, such as cobalt tungsten phosphide. The capping layer may be formed by any technique known in the art, including, but limited to, electroless deposition or electroplating techniques. The capping layer 132 prevents the electromigration and/or diffusion of the conductive material of the interconnect into a subsequently deposited or positioned materials.

Figure 9:
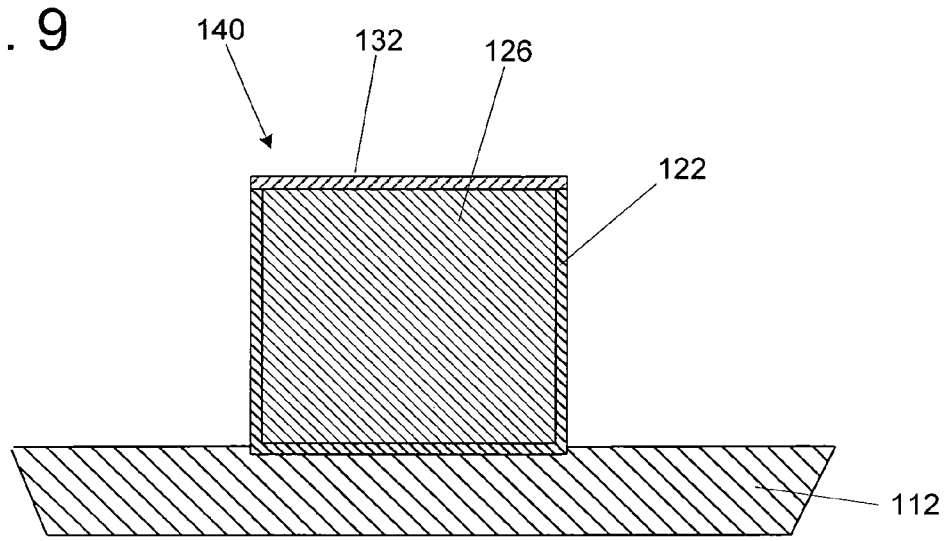
FIG. 9 is a side cross-sectional view of the interconnect structure of FIG. 8, wherein a sacrificial dielectric material layer adjacent the interconnect is removed, according to the present invention.
Figure 10:
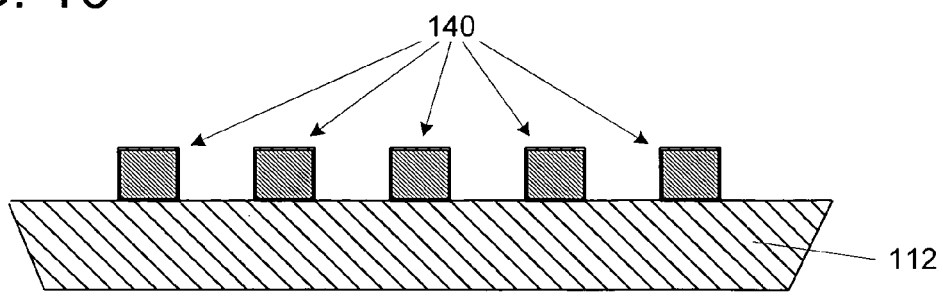
FIG. 10 is a side cross-sectional view of a plurality of interconnect structures, according to the present invention.

As shown in FIG. 9, the sacrificial dielectric material layer 106 is then removed to form the interconnect 140. It is, of course, understood that many interconnects 140 are formed with each process step, as shown in FIG. 10.

In one embodiment, the sacrificial dielectric material layer 106 is a silicon-containing material, including, but not limited to, carbon-doped (porous or non-porous), wherein a wet chemistry process is used for its removal. In such an embodiment, the removal of the sacrificial dielectric material layer 106 can be facilitated by using corrosive chemicals at a high pH, such as a organic hydroxide solution, including, but not limited to a tetra methyl ammonium hydroxide-based (hereinafter "TMAH-based") solution (either aqueous or organic). The corrosive chemicals are chosen to remove the sacrificial dielectric material layer 106 for their ability to attack of the silicon-oxygen bonds or the silicon-carbon bonds (if present in the sacrificial dielectric material layer 106) therein, thereby removing the sacrificial dielectric material layer 106. With high pH solutions, copper containing materials can be self protecting with the formation of $CuO_2$ or go into solution based on the solution itself, as will be understood to those skilled in the art.

In a specific embodiment, the chemical mixture for a silicon-containing, sacrificial dielectric material layer 106 includes a tetra methyl ammonium hydroxide (TMAH) based aqueous or organic solution containing hypochlorite ions (such as from a potassium hypochlorite solution or organic hypochlorite solutions) at a high pH, which has demonstrated high selectivity to the barrier layer 122 (including Ta and TaN), the conductive material layer 126 (including copper-containing materials), and the capping layer 132 (including cobalt-containing materials). In a particular embodiment, the chemical mixture at pH range of about 12 to 14 comprises a TMAH concentration of up to about 10% by volume, preferably between about 5% and 10% by volume, hypochlorite ions in a concentration between about 5% and 15% by volume, and the remainder water (about 80% to 90% by volume). Such chemical mixtures can be obtained from chemical providers, such as Mallinckrodt Baker, Inc. of Phillipsburg, N.J., USA.

The technical advantage of this invention is the selective removal of the sacrificial dielectric material layer 106 while not significantly affecting the conductive material (e.g., copper-containing material) or the barrier materials (e.g., tantalum and/or tantalum nitride). The chemical mixture maintains interconnect structure geometry intact with little or no corner rounding or recessing of copper surface. Furthermore, the chemical mixture has selectivity to the capping layer 132, when it is cobalt-containing material, due to the self-passivation of the cobalt surface resulting from formation of a dual-layer of adsorbed hypochlorite ions and organic cations, as will be understood to those skilled in the art. It has been found that the present process is capable of removing the sacrificial dielectric material layer 106 from spaces as small as 30 to 40 nanometers.

Figure 8:
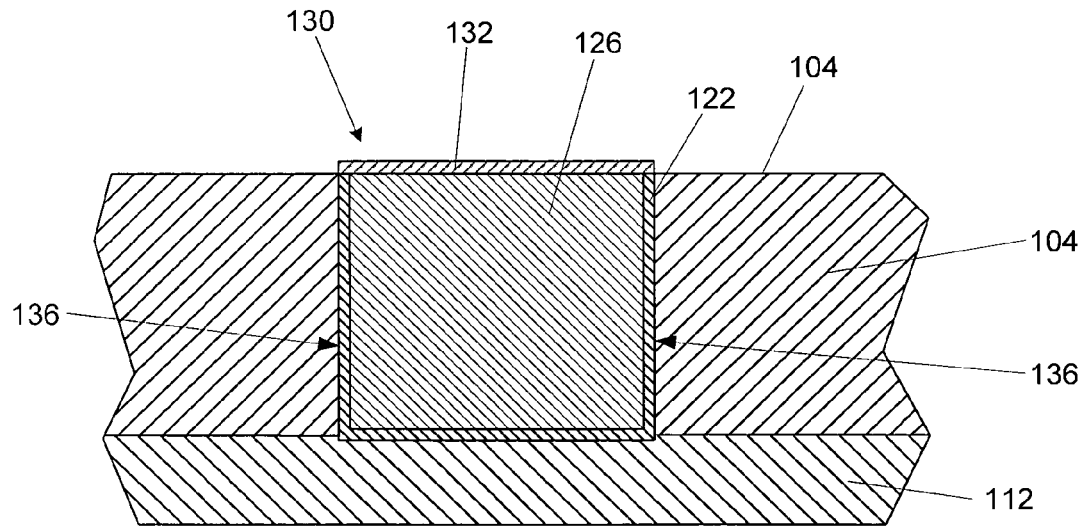
FIG. 8 is a side cross-sectional view of the structure of FIG. 7, wherein a capping layer is formed on the exposed conductive material to form an interconnect, according to the present invention.
Figure 11A:
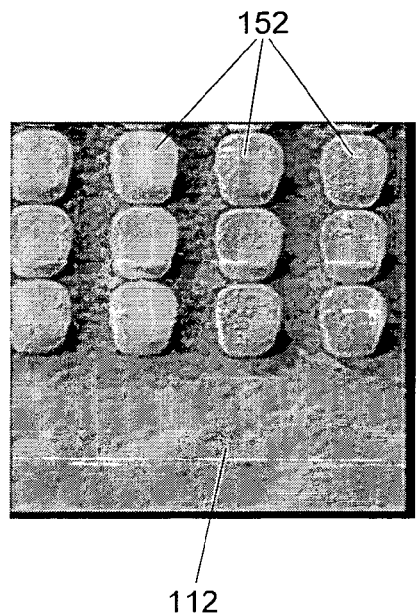
FIGS. 11a and 11b are SEMs illustrating interconnect lines and via-type interconnect structures, respectively, according to the present invention.
Figure 11B:
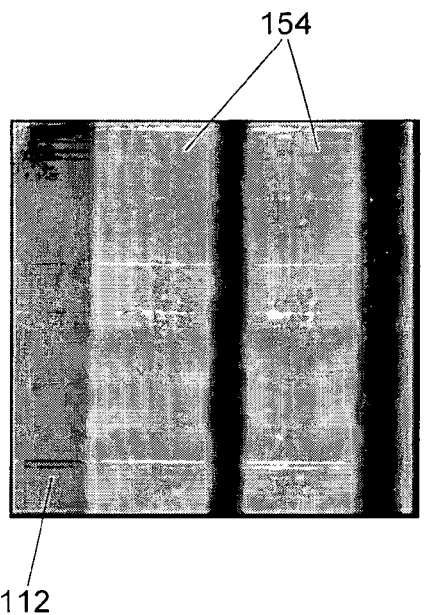

Examples of the copper interconnects, without a barrier layer or a capping layer, formed with the TMAH-based chemical mixture described above is show in FIGS. 11*a* and 11*b*, wherein the sacrificial dielectric material layer 106 (see FIG. 8) has been substantially completely removed leaving the copper interconnects intact (interconnect lines 152 shown in FIG. 10*a* and via-type interconnect structures 154 shown in FIG. 10*b*). The process comprised emersion in the TMAH-based chemical mixture or by having the chemical mixture sprayed on top of a spinning wafer on a single-wafer cleans tool, described above, for a duration of between about 20 to 60 minutes, preferably about 30 minutes, at a temperature between about 0 to 70 degrees Celsius, preferably about 60 degrees Celsius.

Figure 12:
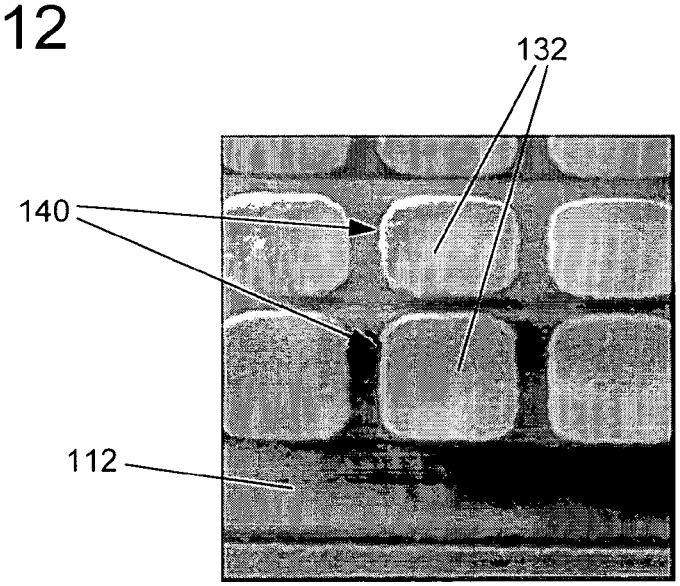
FIG. 12 is a top view SEM of interconnects having capping layers, according to the present invention.

When a capping layer 132 (see FIG. 8) is used for electromigration prevention, as previously discussed, the chemical mixture used to remove the sacrificial dielectric material layer 106 needs to also be selective to the material used for the capping layer 132 (e.g., cobalt-containing materials). For cases where in copper interconnects have cobalt-containing capping layers 132, it known that cobalt is more unstable than copper over all pH ranges (as can be verified with a Pourbaix diagram). For high pH (e.g., equal to greater than about 11) aqueous mixtures, copper is unaffected due to its self-passivation with cuprous oxide ($Cu_2O$), but cobalt is unstable. However, it has been found that the use of an aqueous high pH chemical mixture containing hypochlorite ions and organic cations (such as TMA+) results in a dramatically reduced etch rate of cobalt, even at pH of 12 or greater. This is remarkable given how unstable cobalt is at high pH region. This protection or non-removal of cobalt after exposure of the sacrificial dielectric material layer to the chemical TMAH-based chemical mixture described above is shown in FIG. 12, wherein the exposure duration was about an hour.

It is also understood that the deposition of the cobalt-containing capping layer 132 on copper interconnects 140 prior to the removal of the sacrificial dielectric material layer 106 should be performed due to the cobalt particles that are inherent to electroless cobalt deposition step. If the cobalt-containing capping layer 132 is formed after the sacrificial dielectric material layer 106 is removed, there is a potential that cobalt particles could form a structure in the air spaces between the copper interconnects 140. This could lead to shorting or higher between copper interconnects 140, which, of course, must be avoided. Thus, there is a need for the cobalt-selective, sacrificial dielectric material layer 106 removal chemical mixture, which the present invention satisfies.

Figure 13:
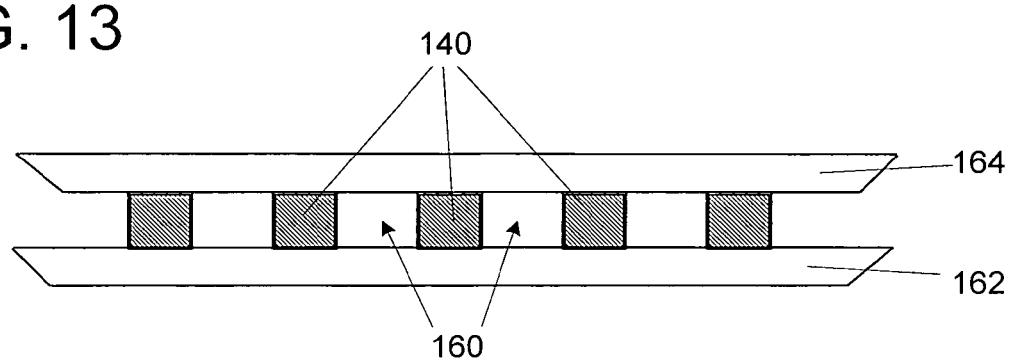
FIG. 13 is a side cross-sectional view of a plurality of interconnects having air gaps therebetween, according to the present invention.
Figure 14:
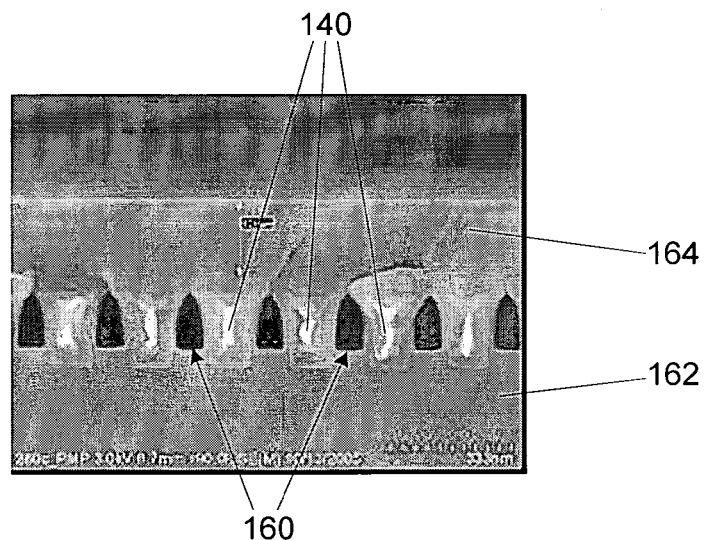
FIG. 14 is a side cross-sectional SEM of a plurality of interconnects having air gaps therebetween, according to the present invention.

It is, of course, understood that although the present invention has been described in terms of the formation of a single interconnect 140, multiple interconnects 140 are formed simultaneously, and that further processing from layers of such interconnects 140. FIGS. 13 and 14 illustrates, as a schematic and an XSEM, respectively, a plurality of interconnects 140 on a first substrate 162, such as dielectric layer, having air gaps 160 therebetween (a second substrate 164, such as a dielectric layer, is shown abutting the interconnects 140 opposing the first substrate 162).

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating an interconnect, comprising:
  providing an intermediate interconnect having a silicon-containing dielectric layer abutting at least one side of said intermediate interconnect; and
  removing at least a portion of said silicon-containing dielectric layer with an alkaline chemical mixture comprising tetra methyl ammonium hydroxide in a concentration between about 5% and 10% by volume, hypochlorite ions in a concentration of between about 5% and 15% by volume, and the remainder water.

2. The method of claim 1, wherein the alkaline chemical mixture has a pH approximately in the range of 12 to 14.

3. The method of claim 1, wherein providing an intermediate interconnect comprises providing an intermediate interconnect containing a copper-containing material 4. The method of claim 3, wherein providing a copper-containing intermediate interconnect comprises providing a copper-containing intermediate interconnect having a barrier layer.

5. The method of claim 4, wherein providing a copper-containing intermediate interconnect having a barrier layer comprises providing an copper-containing intermediate interconnect having a tantalum-containing barrier layer.

6. The method of claim 1, wherein providing an intermediate interconnect comprises providing an intermediate interconnect having a capping layer.

7. The method of claim 6, wherein providing an intermediate interconnect having a capping layer comprises providing an intermediate interconnect having a cobalt-containing capping layer.

8. The method of claim 1, wherein providing an intermediate interconnect having a silicon-containing dielectric layer abutting at least one side of said intermediate interconnect comprises providing an intermediate interconnect having a silicon-containing dielectric layer selected from the group consisting of silicon dioxide, silicon nitride, and carbon doped oxide.

9. A method of fabricating an air gap between interconnects, comprising:
providing at least two interconnects having a silicon-containing dielectric layer therebetween; and
removing said silicon-containing dielectric layer from between said interconnects with an aqueous chemical mixture comprising tetra methyl ammonium hydroxide in a concentration between about 5% and 10% by volume, hypochlorite ions in a concentration of between about 5% and 15% by volume, and the remainder water.

10. The method of claim 9, wherein the alkaline chemical mixture has a pH approximately in the range of 12 to 14.

11. The method of claim 9, wherein providing at least two interconnects comprises providing at least two interconnects containing a copper-containing material.

12. The method of claim 11, wherein providing at least two copper-containing interconnects comprises providing at least two copper-containing interconnects each having a barrier layer.

13. The method of claim 12, wherein providing at least two copper-containing interconnects each having a barrier layer further comprises providing at least two copper-containing interconnects each having a tantalum-containing barrier layer.

14. The method of claim 9, wherein providing at least two interconnects further comprises providing at least two interconnects each having a capping layer.

15. The method of claim 14, wherein providing at least two interconnects each having a capping layer comprises providing at least two interconnects each having a cobalt-containing capping layer.

16. The method of claim 9, wherein providing at least two interconnects having a silicon-containing dielectric layer therebetween comprises providing at least two interconnects having a silicon-containing dielectric layer therebetween selected from the group consisting of silicon dioxide, silicon nitride, and carbon doped oxide.

* * * * *